(12) United States Patent
Kawashima

(10) Patent No.: US 7,145,635 B2
(45) Date of Patent: Dec. 5, 2006

(54) EXPOSURE METHOD AND APPARATUS

(75) Inventor: Haruna Kawashima, Haga-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 114 days.

(21) Appl. No.: 11/017,788

(22) Filed: Dec. 22, 2004

(65) Prior Publication Data

US 2005/0151942 A1    Jul. 14, 2005

(30) Foreign Application Priority Data

Dec. 26, 2003    (JP) .............................. 2003-432769

(51) Int. Cl.
*G03B 27/42*    (2006.01)

(52) U.S. Cl. ............................ 355/53; 355/67; 355/71; 378/34; 378/35

(58) Field of Classification Search ...................... None
See application file for complete search history.

(56) References Cited

U.S. PATENT DOCUMENTS

| | | | |
|---|---|---|---|
| 2003/0020893 A1 | 1/2003 | Kawashima | ................. 355/53 |
| 2004/0240071 A1 | 12/2004 | Kawashima | ................. 359/603 |
| 2005/0030506 A1* | 2/2005 | Schuster | ........................ 355/55 |
| 2005/0248856 A1* | 11/2005 | Omura et al. | ................. 359/726 |
| 2005/0286030 A1* | 12/2005 | Shih et al. | ..................... 355/30 |
| 2006/0098180 A1* | 5/2006 | Bleeker | ........................ 355/53 |

FOREIGN PATENT DOCUMENTS

| | | |
|---|---|---|
| JP | 10-303114 | 11/1998 |
| JP | 2003-017396 | 1/2003 |
| JP | 2003-135578 | 5/2003 |

* cited by examiner

*Primary Examiner*—D. Rutledge
(74) *Attorney, Agent, or Firm*—Fitzpatrick, Cella, Harper & Scinto

(57) ABSTRACT

An exposure apparatus includes a projection optical system for projecting a pattern on a mask onto an object to be exposed, a final surface of the projection optical system and a surface of the object immersed in a fluid, and a plane-parallel plate arranged between the projection optical system and the object. The plane-parallel plate includes a first surface and a second surface that serves as a back surface of the first surface and opposes to the object. Both the first and second surfaces are immersed in the fluid and the plane-parallel plate has an antireflection coating that is designed according to an incident light at an angle corresponding to a numerical aperture of the projection optical system.

9 Claims, 7 Drawing Sheets

PRIOR ART

EXPOSURE METHOD AND APPARATUS

BACKGROUND OF THE INVENTION

The present invention relates generally to an exposure apparatus and a method used to fabricate various devices, including semiconductor chips such as ICs and LSIs, display devices such as liquid crystal panels, sensing devices such as magnetic heads, and image pickup devices such as CCDs, as well as fine patterns used for micromechanics, and, more particularly, to an immersion type exposure method and apparatus for immersing the final surface of the projection optical system and the surface of the object in the fluid and exposing the object through the fluid.

The projection exposure apparatus employed to manufacture a semiconductor device, a liquid crystal display device, etc., is required to use an increased numerical aperture ("NA") of a projection optical system and a shortened wavelength of an exposure light. A KrF stepper (with $\lambda$=about 248 nm) used an NA of 0.65 in 2000. The projection exposure apparatus is being shifted from the stepper to a scanner to which a high NA projection lens and KrF and ArF ($\lambda$=about 193 nm) lasers are applicable. The current scanners use a projection lens having an NA up to 0.8 with a light source, such as KrF and ArF lasers. A prospective scanner that will appear in the market within several years will use a projection optical system having an NA of 0.85 and a light source of KrF, ArF, and even $F_2$ ($\lambda$=about 157 nm) lasers. Discussions have started about whether it is possible to develop a projection optical system having an NA up to 0.95 of a dry system that uses the gas for a medium between lenses as an ultimate projection optical system for the photolithography.

An antireflection coating for an optical element progresses as the projection optical system progresses. When the projection exposure apparatus appeared with a light source of KrF and ArF excimer lasers in 1990, the coating material for the antireflection coating became restricted, such as $SiO_2$ and $MgF_2$ as a low refractive index material having a refractive index between 1.45 and 1.55, and $Al_2O_3$ and $LaF_3$ as a middle refractive index material having a refractive index between 1.65 and 1.75. This limit increases the design difficulty and requires a reduction of the transmission loss due to absorptions in the coating, contaminated substrate, and scattering in the coating layer, which has conventionally been negligible.

In this background, the immersion exposure has attracted attention as one measure to improve the resolution while using the ArF and $F_2$ lasers (see, for example, Japanese Patent Application, Publication No. 10-303114). The immersion exposure promotes the higher numerical aperture ("NA") by replacing a medium (typically, air) at the wafer side of the projection exposure with the fluid. The projection exposure apparatus has an NA of $n \cdot \sin \theta$, where n is a refractive index of the medium, and the NA increases when the medium that has a refractive index higher than the refractive index of air, i.e., n>1. For example, when the fluid is pure water (with a refractive index of n=1.33), and the maximum incident angle of the light that images on the wafer is the same between the dry system and the wet system, the wet system's resolving power improves by 1.33 times. In other words, the NA in the wet system corresponds to 1.33 times as large as the NA of the dry system. If the apparatus's limit of the incident angle of the light that images on the wafer is 70°, the NA of the dry system has a limit of 0.94, whereas the NA of the wet system has a limit of 1.25 (when converted into the dry system), providing a projection optical system with a high NA. When the final surface of the projection lens is contaminated in the immersion projection optical system, the immersed optical element should be easily replaced. Therefore, Japanese Patent Application, Publication No. 10-303114, proposes a structure that provides the final surface of the projection lens with a plane-parallel plate.

As described by this inventor in Japanese Patent Application No. 2003-135578, the P-polarized light reflectance of the antireflection coating in the high NA projection optical system remarkably increases, as shown in FIG. 7, when the antireflection coating receives the light from the air layer and exceeds the Brewster angle that is determined by the refractive index of the final layer of the antireflection coating (at the air side). In general, it is usual to use a low refractive index material for the antireflection coating's final layer that contacts the air so as to design the reflectance to be reduced in the wide incident-angle range. Even when the basic coating design changes, as shown in FIG. 8, the reflectance becomes similar values, as the incident angle increases, if the material of the final layer that contacts the air is the same. Although the phase change between the P-polarized light and the S-polarized light is negligible in a range below the Brewster angle, their transmission phase changes become large once the angle exceeds the Brewster angle and the influence to the aberration of the projection optical system cannot be negligible.

Therefore, the antireflection coating having a limited usable coating material for the $F_2$, ArF and KrF lasers disadvantageously deteriorates both the transmittance and the imaging performance of the projection optical system once the NA of 0.85 or 58° of the light exceeds the Brewster angle. It is also necessary to consider the limits of the antireflection coating in the projection optical system of the wet system. While the immersion exposure apparatus disclosed in Japanese Patent Application, Publication No. 10-303114, uses the plane-parallel plate for the final optical element in the projection optical system and facilitates the replacement, an immersion structure of the plane-parallel plate at only the wafer side poses a problem of the total reflection at the interface between the plane-parallel plate and the air layer at the side of the projection optical system when the NA of the projection optical system exceeds 1.0.

BRIEF SUMMARY OF THE INVENTION

Accordingly, it is an exemplary object of the present invention to provide an exposure method and apparatus, which maintain the high transmittance and high imaging performance using an NA of 0.85 or greater.

An exposure method according to one aspect of the present invention includes a projection optical system for projecting a pattern on a mask onto an object to be exposed, a final surface of the projection optical system and a surface of the object being immersed in a fluid, and a plane-parallel plate arranged between the projection optical system and the object, wherein the plane-parallel plate includes a first surface and a second surface that serves as a back surface of the first surface and opposes the object, both the first and second surfaces being immersed in the fluid.

An exposure method according to another aspect of the present invention for immersion, in a fluid, a surface of an object to be exposed, and a final surface of a projection optical system, and for projecting a pattern on a mask onto the object via the projection optical system, includes the steps of immersing, in the fluid, a first surface of a plane-parallel plate arranged between the projection optical system and the object, immersing, in the fluid, a second surface of the plane-parallel plate which serves as a back surface of the first surface and opposes to the object, and projecting the pattern on the object via the plane-parallel plate.

A device manufacturing method according to another aspect of the present invention includes the steps of exposing an object using the above exposure apparatus, and developing an object that has been exposed. Claims for a device fabricating method for performing operations similar to that of the above exposure apparatus cover devices as intermediate and final products. Such devices include semiconductor chips, such as LSIs and VLSIs, CCDs, LCDs, magnetic sensors, thin film magnetic heads, and the like.

Other objects and further features of the present invention will become readily apparent from the following description of the preferred embodiments with reference to the accompanying drawings.

DETAILED DESCRIPTION OF THE PREFERRED EMBODIMENTS

Figure 1:
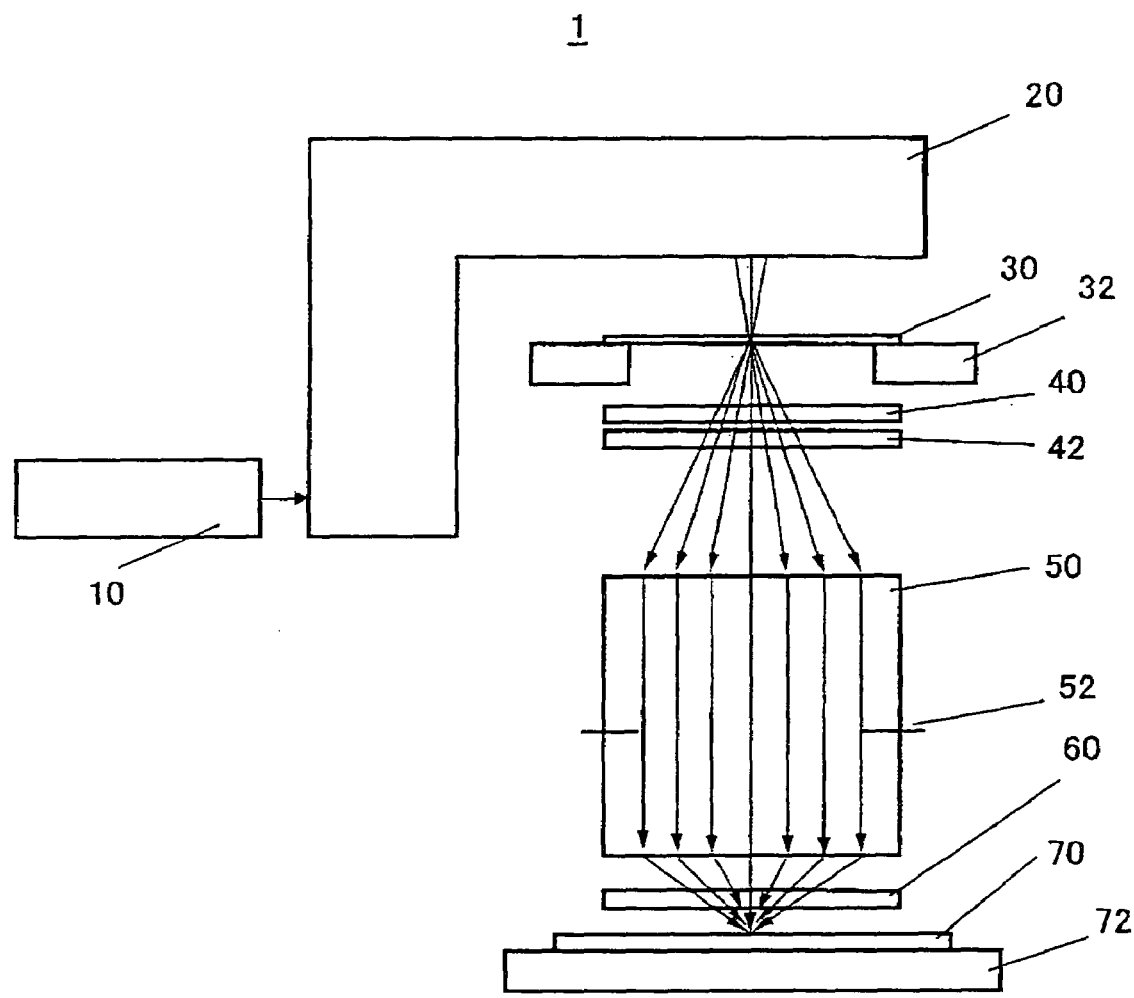
FIG. 1 is a schematic block diagram of an exposure apparatus according to one embodiment of the present invention.
Figure 2:
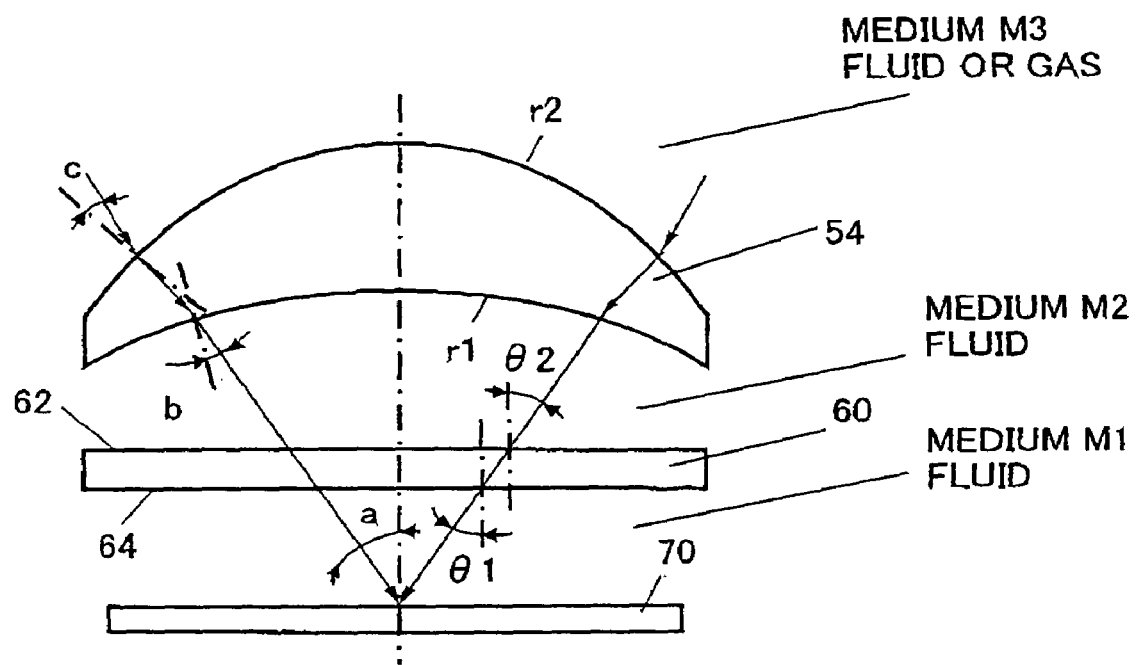
FIG. 2 is a schematic enlarged sectional view of an immersed portion of a projection optical system shown in FIG. 1.

Referring now to FIGS. 1 and 2, a description will be given of an exposure apparatus 1 according to one embodiment according to the present invention. Here, FIG. 1 is a schematic block diagram of a projection exposure apparatus (scanner) 1. In FIG. 1, reference numeral 10 denotes a light source, such as an excimer laser, another continuously oscillating laser, and a Hg lamp. Reference numeral 20 denotes an illumination optical system. Reference numeral 30 denotes a reticle (or a mask) placed on a reticle stage 32. Reference numeral 50 denotes a projection optical system that transfers a circuit pattern on the reticle 30 onto a resist applied wafer 70 placed on a wafer stage 72. The projection optical system 50 has an aperture stop 52 inside it, and projects the diffracted light within a predetermined aperture, from the circuit pattern on the reticle 30 onto the resist applied wafer 70 at a reduced size. A plane-parallel plate 60 is arranged between the projection optical system 50 and the wafer 70 so that the plane-parallel plate 60 can be replaced when contaminated. This plane-parallel plate 60 is made of a quartz or calcium fluoride substrate. When the quartz substrate is used, the material deteriorates due to the laser irradiation and, thus, a structure preferably facilitates the replacement of the substrate. When the calcium fluoride substrate is used, the coating is preferably applied on the substrate surface to prevent the deliquescence. Two sheet glasses 40 and 42 are located below the reticle, and are used for aberrational adjustments. A total thickness of the two corrects the spherical aberration. An inclination of the two together corrects the on-axis astigmatism. The two sheet glasses angled in a wedge shape correct the on-axis coma.

In order to implement the wet type of projection optical system 50 having an NA of 1.0 or greater (when converted into the dry system), this embodiment immerses, in the fluid, the plane-parallel plate 60 at both sides of the wafer 70, and the projection optical system 50 (or surfaces 62 and 64 in FIG. 2, which will be described later).

Referring now to FIG. 2, a more detailed description will be given of the immersed portion of the projection optical system 50. Here, FIG. 2 is a schematic enlarged section of the immersed portion of the projection optical system 50. Reference numeral 54 denotes the final lens in the projection optical system 50, and the plane-parallel plate 60 is arranged between the final lens 54 and the wafer 70. A medium M1 fills a space between the wafer 70 and the plane-parallel plate 60. A medium M2 fills a space between the plane-parallel plate 60 and the final lens 54. A medium M3 fills a space between the final lens 54 and a next lens (not shown).

The necessary condition to implement the wet system of the projection optical system having an NA of 1.0 or greater (when converted into the dry system) is that the media M1 and M2 that sandwich the plane-parallel plate 60 are made of the fluid. The sufficient condition is that the incident and exit angles of the light upon and from the optical element in the projection optical system are maintained in a range below the Brewster angle due to the performance limits of the antireflection coating, as described in Japanese Patent Application No. 2003-135578. When the light proceeds from the medium M1 to medium M2, the Brewster angle θbs (bs means Brewster) generally satisfies the following equation, where n1 is a refractive index of the medium M1 and n2 is a refractive index of the medium M2:

$$\theta bs = arc\ tan(n2/n1). \tag{1}$$

Here, the antireflection coating is applied on the plane-parallel plate 60. When M2 is air (n1=1.0) and the final layer of the antireflection coating at the medium M2 side is $SiO_2$ (n2=1.56), θbs (dry system) becomes 57°. While the refractive index of the antireflection coating's final layer slightly differs according to wavelengths and materials, the refractive indexes for the KrF, ArF and $F_2$ lasers are almost the same and the Brewster angle becomes approximately equal to the maximum light angle at the NA of 0.85. In FIG. 2, in order for θ2 to be smaller than θbs (dry system) in FIG. 2, the following equation should be met where the medium M1 is pure water (having a refractive index of 1.33):

$$\theta 1 < arc\ sin((sin\ 57°)/1.33) = 39° \tag{2}$$

When θ1 in the immersion system is converted into 1.33 sin θ1 in the dry system, the NA becomes almost 0.85. In other words, in the wet system of the projection optical system having an NA between 0.85 and 1.0 where only the medium M1 is the fluid and the medium M2 is gas, the transmittance attenuation can occur because the light incident angle exceeds the Brewster angle at the interface between the plane-parallel plate 60 and the medium M2 (gas). As a solution for this problem, this embodiment uses fluid (pure water) for the medium M2. A single layer coating is sufficient for the antireflection coating for the immersion system and the refractive index of the antireflection coating is preferably between the refractive index of the pure water and that of the glass material of the lens. This is because the glass material of the lens has a refractive index between about 1.5 and 1.6, and a difference of the refractive index between the pure water and the glass material of the lens is small, such as about 0.2 and 0.3. One example of this material is $MgF_2$, and the Brewster angle in the immersion system is θbs (wet system) of 46.5° where the refractive index of the medium M2 is n2=1.4. Therefore, the following equation is met:

$$\theta1=\theta2<\theta bs(\text{wet system})=46.5°. \quad (3)$$

When θ1 in the immersion system is converted into 1.33 sin θ1 in the dry system, it corresponds to an NA of 0.96. In the wet system of a projection optical system having the NA up to 0.96, the light incident angle and exit angle never exceed the Brewster angle, only if both sides of the plane-parallel plate 60 or the surfaces 62 and 64 are immersed in the fluid. The surfaces 62 and 64 have a front and back relationship, and the surface 64 opposes the wafer 70.

On the other hand, although the mere configuration that makes the media M2 and M1 to be the fluid could cause the light incident angle and exit angle to exceed the Brewster angle at the NA of 0.96 or greater, the instant inventor has discovered that the optimization of the antireflection coating for the immersion system can solve this problem.

Figure 3:
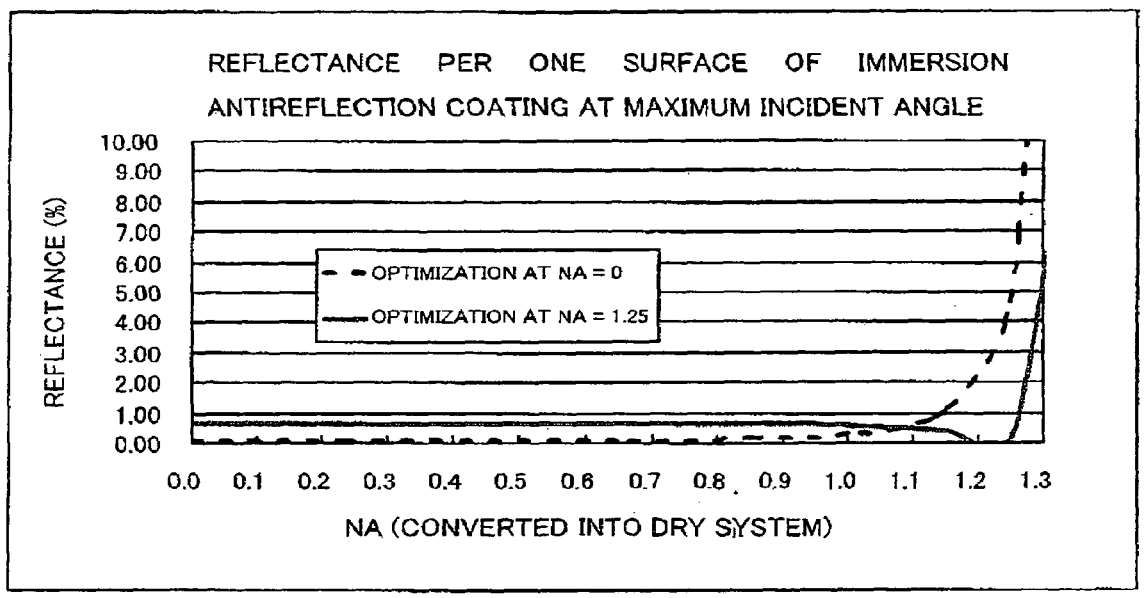
FIG. 3 is the reflectance of an antireflection coating for the immersion system at the maximum incident angle.
Figure 8:
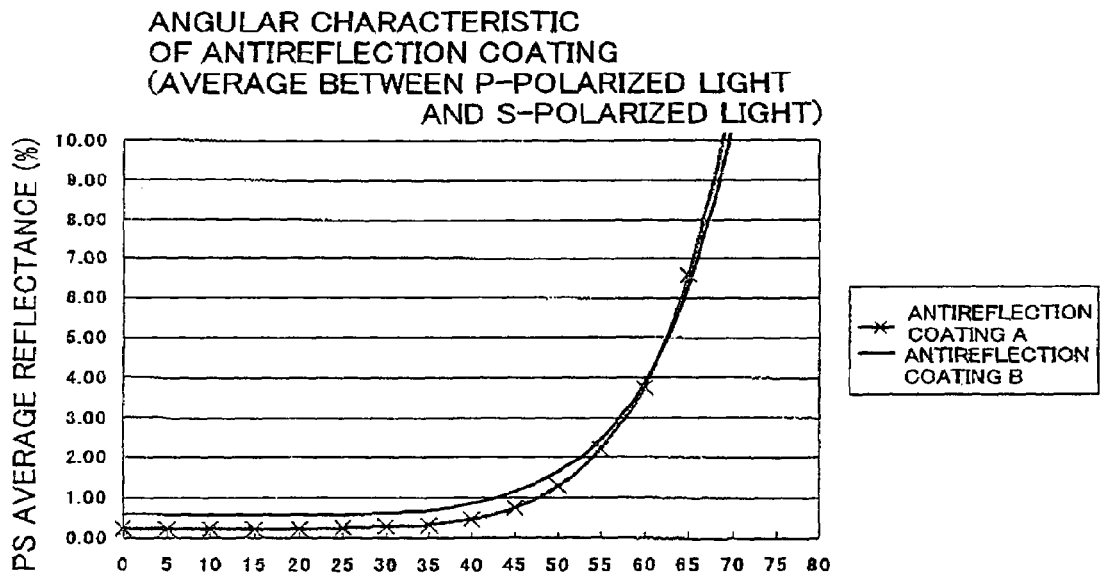
FIG. 8 shows the reflectance changes relative to the incident angle.

FIG. 3 plots the reflectance of the antireflection coating for the immersion system relative to the abscissa axis NA (that is converted into the dry system). In FIG. 3, the plots shown by a broken line set such a coating thickness that the reflectance becomes minimum in response to the perpendicularly incident light. The plots shown by a solid line set such a coating thickness that the reflectance minimizes for the light having an NA=1.25. It is understood that the plots of the wet system shown by the broken line more moderately increase the reflectance after the angle exceeds the Brewster angle (about NA=0.96) than that of the dry system shown in FIG. 8 (in which the Brewster angle is about 58°). It is also understood that even the antireflection coating that minimizes the reflectance to the light having the NA of 1.25 can reduce the reflectance below 1% at the NA up to 1.0 in the wet system, as shown by the solid line in FIG. 3.

A refractive-index difference between the antireflection coating's final layer and the immersion medium in the wet system is thus smaller than half that in the dry system. When the limit of the dry system is an NA of 0.85, an NA of 1.28 or lower is viable in the wet system. Therefore, even in the wet system of a projection optical system having an NA up to 1.28 or the apparatus's limit NA, a problem of the transmittance attenuation does not occur, even when the light incident and exit angles increase, only if both sides of the plane-parallel plate 60 are immersed in the fluid, and the antireflection coating of the plane-parallel plate is optimized.

Turning back to FIG. 2, the final lens 54 in the projection optical system 50 has front and back surfaces r1 and r2 and a normal is shown by an alternate long and short dash line. An illustrated arrow indicates a ray having the maximum aperture (or NA) that can pass in the projection optical system 50. The ray having the maximum aperture has incident angles "a" and "c" on the wafer 70 and the surface r1 of the final lens 54, and an exit angle "b" on the surface r2 of the final lens 54. The lens 54 includes at least one meniscus lens that satisfies: a>39° (that corresponds to an NA of 0.85 when converted into the dry system), c<b≦Brewster angle determined by the antireflection coating's final layer (at the fluid side) on the surface r2, and c<Brewster angle determined by the antireflection coating's final layer (at the fluid or gas side) on the surface r1.

Although the reflectance of the antireflection coating in the immersion system is lower than that in the dry system, the coating that is designed such that the reflectance is minimum to the perpendicularly incident light shown by the broken line has a much better characteristic than that shown by the solid line, as shown in FIG. 3. Therefore, only the plane-parallel plate 60, which is a minimum necessary, preferably has the surface on which the incident and exit angles exceed the Brewster angle.

Whether the pure water (or the immersion system) or the air (the dry system) fills the space above the final lens is determined as follows: The fluid is set to the medium (the wet system) in the case of θbs (dry system)<θN, and the air is set to the medium (dry system) in the case of θN≦θbs (dry system), where θN is the light incident angle upon the N-th lens (when the N-th lens is the final lens, then "c" in FIG. 5).

Figure 4:
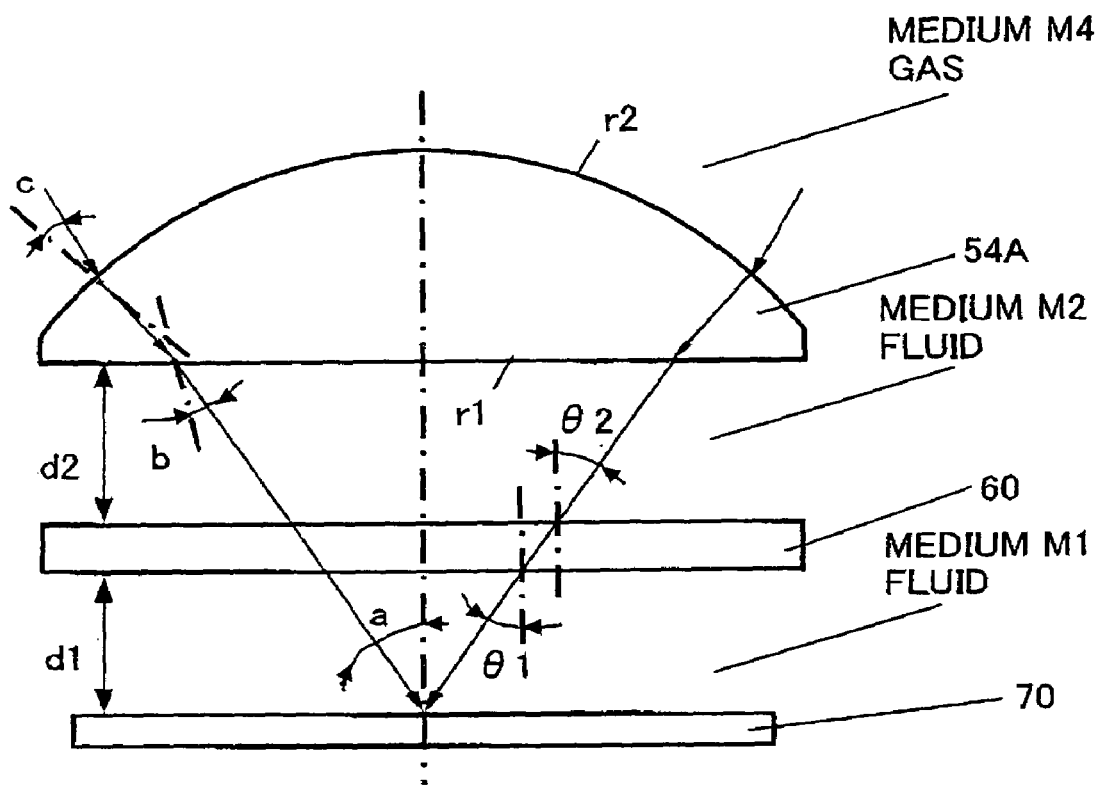
FIG. 4 is a partial explanatory view of an inventive immersion, high-NA projection optical system.

Referring now to FIG. 4, a description will be given of another embodiment of the present invention. The temperature coefficient of the refractive index of the air is $-9\times10^{-7}/°$ C., whereas that of the pure water is $-8\times10^{-5}/°$ C. It is thus known that the pure water has a temperature sensitivity more than one hundred times as high as that of the air. It is preferable that the immersed portion is the minimum necessary. This embodiment limits the immersed portion only to both sides of the plane-parallel plate 60. Therefore, the medium M4 is made of gas. The surface r1 is a plane in this embodiment, and the projection optical system 50 has a planoconvex lens as the final lens 54A. The meniscus final lens 54 shown in FIG. 2 causes the temperature rise in the medium M2 as the fluid due to the exposure light, and the fluid that has a higher temperature than the periphery would gather at the vertex part on the surface r1 and could deteriorate the imaging performance. The planoconvex final lens 54A does not cause gathering of the fluid that has a higher temperature than the periphery. The planoconvex final lens 54A satisfies a>39° (corresponding to an NA of 0.85 when converted in the dry system), c<b, and c<Brewster angle determined by the antireflection coating's final layer (at the gas side) on the surface r1. Thus, this embodiment limits the surface on which the incident and exit angles exceed the Brewster angle to both plane surfaces of the plane-parallel plate 60 and the plane of the planoconvex lens 54A, and the immersed portion to both sides of the plane-parallel plate 60.

In FIG. 2, the medium M1 that contacts the wafer 70 is configured not to mix the medium M2 or M3. A circulation of each medium is controlled as a closed circulation system so as to prevent erosion of the fluids and gathering of the dissolved impurities. In order to restrain the temperature rise in each medium due to the exposure light, it is preferable that each circulation system is temperature-controlled.

Conceivably, the immersed portion of the medium M1 contacting the wafer 70 that is driven at a high speed is subject to the temperature rise due to the absorption of the exposure light and the heat associated with driving. The influence of the refractive-index changes of the fluid to the imaging performance is considered to be proportional to the temperature rise of the fluid and the optical-path length in the fluid. Therefore, a structure preferably maintains the temperature rise of the fluid to be as low as possible, and to maintain a relationship of d1<d2, where d1 is a distance of the medium M1 and d2 is a distance of the medium M2. This is because the wafer side is more subject to the heat from a driving mechanism for the stage, etc. For example, the projection optical system 50 usually has a back focus of about 20 mm. Moreover, the plane-parallel plate needs a thickness of at least 5 mm in order to eliminate the influence of the surface deflection due to its own weight. Then, optimal d1 and d2 are d2=10 mm or greater d1=5 mm or smaller.

Figure 5:
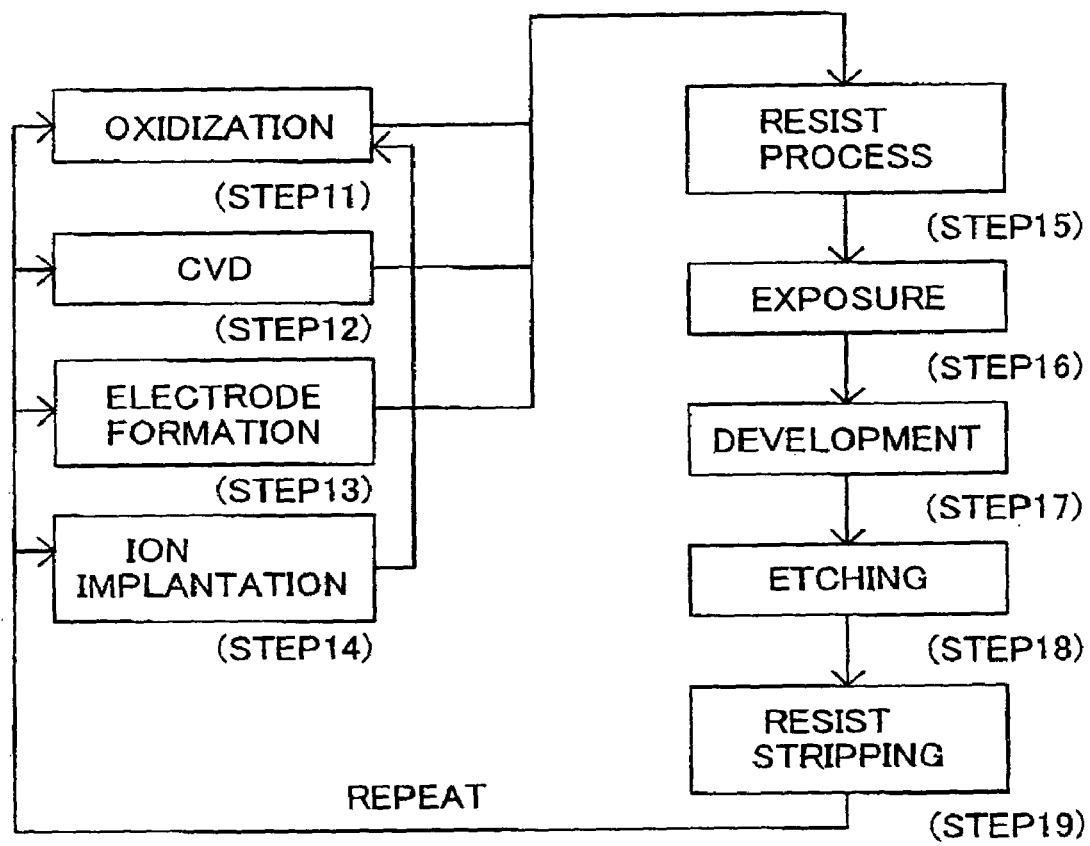
FIG. 5 is a flowchart for explaining a device manufacturing method using the inventive exposure apparatus.
Figure 6:
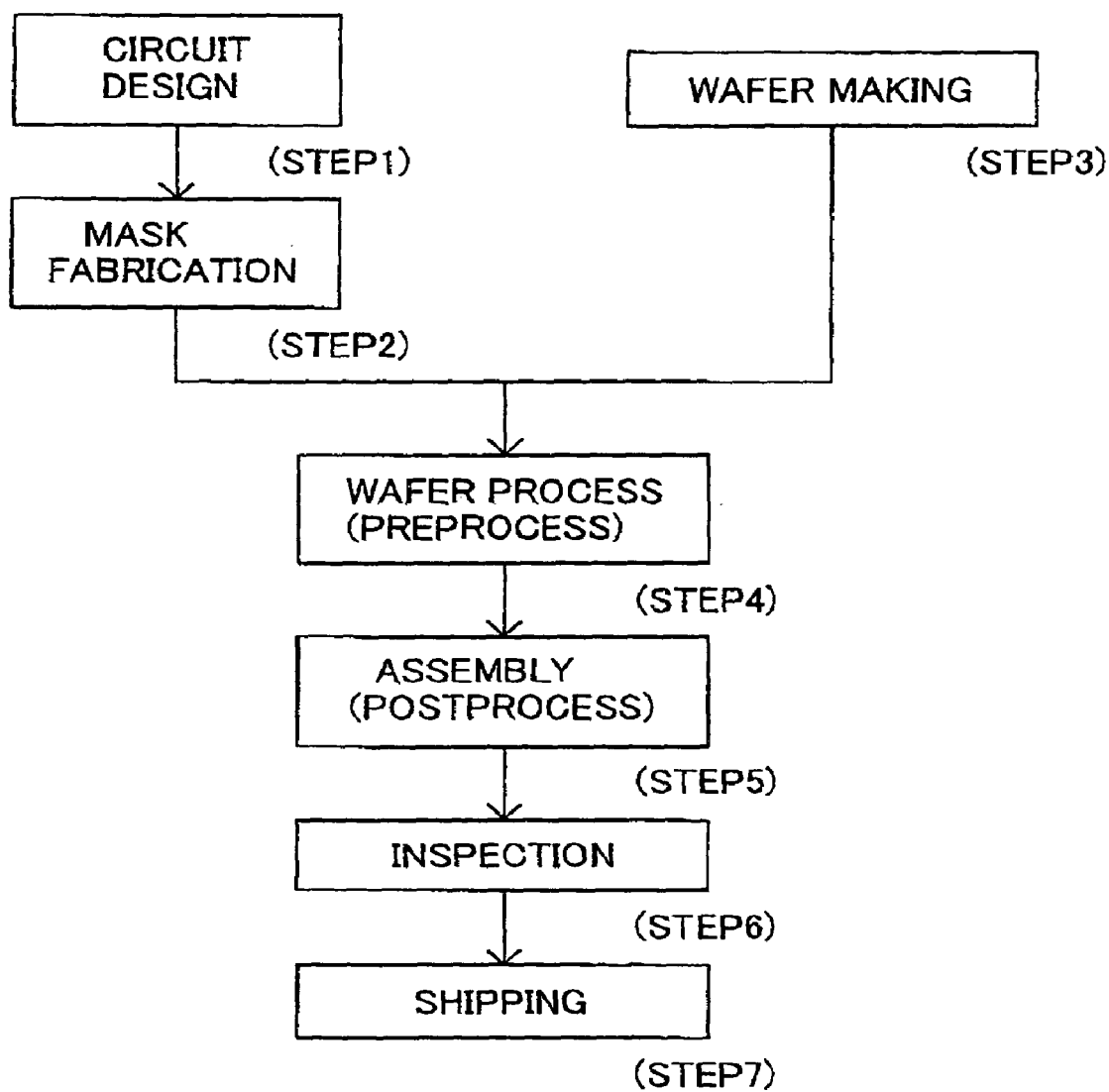
FIG. 6 is a detailed flowchart of a step 4 shown in FIG. 5.
Figure 7:
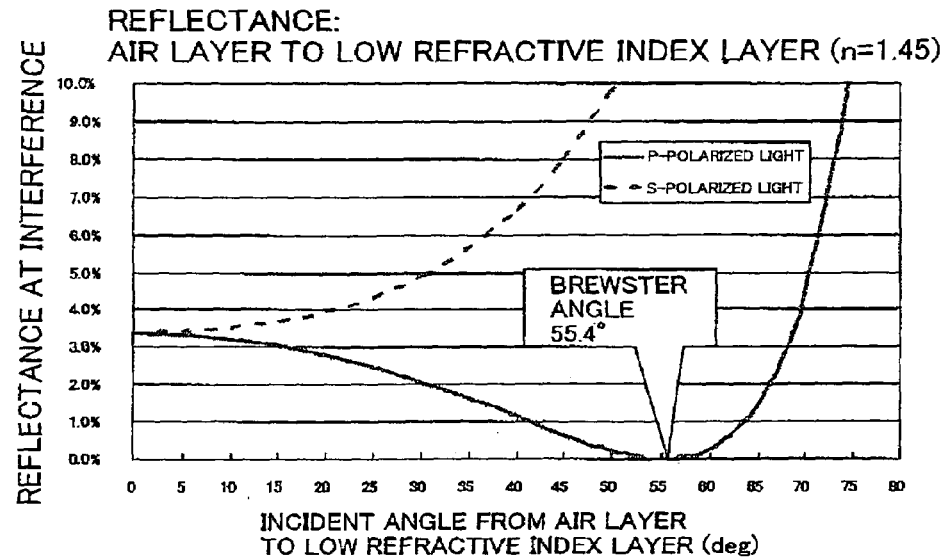
FIG. 7 shows a relationship between reflectance changes and the Brewster angle to the incident angle upon the antireflection coating.

Referring to FIGS. 5 and 6, a description will now be given of an embodiment of a device fabricating method using the above exposure apparatus. FIG. 5 is a flowchart for explaining a fabrication of devices (i.e., semiconductor chips, such as ICs and LSIs, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 6 is a detailed flowchart of the wafer process in Step 4 shown in FIG. 5. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes the unused resist after etching. These steps are repeated, and multilayer circuit patterns are formed on the wafer. The device fabrication method of this embodiment may manufacture higher quality devices than conventional ones. Thus, the device fabrication method using the exposure apparatus, and the devices as finished goods also constitute one aspect of the present invention. The present invention covers devices as intermediate and final products. Such devices include semiconductor chips, such as LSIs and VLSIs, CCDs, LCDs, magnetic sensors, thin film magnetic heads, and the like.

Further, the present invention is not limited to these preferred embodiments, and various variations and modifications may be made without departing from the scope of the present invention. For example, while the instant embodiment forms the plane-parallel plate 60 as a separate member from the projection optical system 50, the plane-parallel plate 60 may be a part of the projection optical system 50.

The immersion exposure apparatus of this embodiment, which has an NA of 0.85 or greater, provides the projection optical system with high transmittance from the center to the periphery on the pupil, improves not only the light intensity efficiency of a modified illumination in which the diffracted light enters the periphery on the pupil in the projection optical system, but also, the contrast and symmetry of a resolution limit pattern. The projection optical system of a wet type having an NA of 0.85 or greater can manufacture, at a high yield, semiconductor devices that have a resolution limit pattern of the photolithography.

The present invention can provide an exposure method and an apparatus, which maintain high transmittance and high imaging performance, as well as having an NA of 0.85 or greater.

This application claims foreign priority benefits based on Japanese Patent Application No. 2003-432769, filed on Dec. 26, 2003, which is hereby incorporated by reference herein in its entirety as if fully set forth herein.

What is claimed is:

1. An exposure apparatus comprising:
    a projection optical system for projecting a pattern on a mask onto an object to be exposed, a final surface of said projection optical system and a surface of the object being immersed in a fluid; and
    a plane-parallel plate arranged between said projection optical system and the object,
    wherein said plane-parallel plate includes a first surface and a second surface that serves as a back surface of the first surface and opposes to the object, both the first and second surfaces being immersed in the fluid, and said plane-parallel plate has an antireflection coating that is designed according to an incident light at an angle corresponding to a numerical aperture of said projection optical system.

2. An exposure apparatus according to claim 1, wherein said projection optical system includes an optical element that is closest to said plane-parallel plate, and a medium that contacts a surface of the optical element at a side opposite to the plane-parallel plate is gas.

3. An exposure apparatus according to claim 1, wherein said projection optical system includes an optical element that is closest to said plane-parallel plate, and the optical element has a plane surface at the side of said plane-parallel plate.

4. An exposure apparatus according to claim 3, wherein an incident angle of light upon the optical element is maintained below the Brewster angle.

5. An exposure apparatus according to claim 3, wherein a distance between the first surface and the optical element is longer than a distance between the second surface and the object.

6. An exposure apparatus according to claim 1, wherein said plane-parallel plate has a quartz substrate.

7. A device manufacturing method comprising the steps of:
    exposing an object using an exposure apparatus according to claim 1; and
    developing an object that has been exposed.

8. An exposure apparatus comprising:
    a projection optical system for projecting a pattern of a mask onto an object to be exposed, a final surface of said projection optical system and a surface of the object being immersed in a fluid; and
    a plane-parallel plate arranged between said projection optical system and the object,
    wherein said plane-parallel plate includes a first surface and a second surface that serves as a back surface of the first surface and opposes the object, both the first and second surfaces being immersed in the fluid, said projection optical system includes an optical element that is closest to said plane-parallel plate, the optical element has a plane surface at the side of said plane-parallel plate, and an incident angle of light upon the optical element is maintained below a Brewster angle.

9. A device manufacturing method comprising the steps of:
    exposing an object using an exposure apparatus according to claim 8; and
    developing an object that has been exposed.

* * * * *